United States Patent [19]
Morishita

[11] Patent Number: 6,038,189
[45] Date of Patent: Mar. 14, 2000

[54] SEMICONDUCTOR DEVICE ALLOWING EXTERNAL SETTING OF INTERNAL POWER SUPPLY VOLTAGE GENERATED BY A VOLTAGE DOWN CONVERTER AT THE TIME OF TESTING

[75] Inventor: Fukashi Morishita, Hyogo, Japan

[73] Assignee: Mitsubishi Denki Kabushiki Kaisha, Tokyo, Japan

[21] Appl. No.: 09/087,868

[22] Filed: Jun. 1, 1998

[30] Foreign Application Priority Data

Nov. 28, 1997 [JP] Japan ................................. 9-328322

[51] Int. Cl.⁷ ........................................................ G11C 5/14
[52] U.S. Cl. ........................ 365/227; 365/226; 365/189.09; 365/189.11; 365/189.07; 365/201; 327/535; 327/537; 327/538

[58] Field of Search ....................................... 365/227, 226, 365/189.09, 189.11, 189.07, 201; 327/535, 537, 538, 540, 541

*Primary Examiner*—Andrew Q. Tran
*Attorney, Agent, or Firm*—McDermott, Will & Emery

[57] ABSTRACT

In a voltage down converter, an internal power supply potential can be made equal to an external power supply potential by rendering an output driving transistor included in differential amplifiers conductive in accordance with an activation of a burn-in mode detection signal. The differential amplifiers include a comparison circuit having an output changed to an inactive state in response to the burn-in mode detection signal and a transistor setting a level of a gate voltage of the drive transistor to a fixed level.

10 Claims, 16 Drawing Sheets

SEMICONDUCTOR DEVICE ALLOWING EXTERNAL SETTING OF INTERNAL POWER SUPPLY VOLTAGE GENERATED BY A VOLTAGE DOWN CONVERTER AT THE TIME OF TESTING

BACKGROUND OF THE INVENTION

1. Field of the Invention

The present invention relates generally to a semiconductor device, and more particularly, to a semiconductor device having a circuit associated with a reliability evaluation testing.

2. Description of the Background Art

Recently, together with the advancement of the integration of semiconductor devices and the miniaturization of MOS transistors, a thickness of a gate oxide film of an MOS transistor have been decreasing, leading to the decreased breakdown voltage of the gate oxide film. Therefore a high gate voltage may have an adverse effect on the reliability of an MOS transistor.

In some systems using a semiconductor memory device, a voltage required for an operation of the semiconductor memory device is lower than a power supply voltage of the system itself. In such a case, the power supply voltage for the semiconductor memory device is generally supplied from the power supply voltage of the system itself, by generating an internal power supply voltage required for the operation of the semiconductor memory device by pulling down the voltage inside the semiconductor memory device.

A circuit generating the internal power supply voltage in this manner is called a voltage down converter. Use of such a voltage down converter allows the substantial reduction of the power consumption by the semiconductor memory device thus stabilizing the internal power supply voltage used therein.

Now, the reliability evaluation test will be described.

Generally, a life of a device can be divided into three periods based on the characteristics of failures. That is, an early failure period, followed by a random failure period and a wear-out failure period.

Immediately after the device is put under use, the early failure period starts. During this period, early failures originating from defects at the time of manufacture of the device are revealed. The rate of an early failure rapidly decreases with time.

Then a long random failure period with a low failure rate lasts for a certain period.

As the device approaches the end of its useful life, it enters the wear-out failure period where the failure rate dramatically increases.

The device is desirably used in the random failure period, which is regarded as equivalent to the service life of the device. Therefore, the random failure period is required to last long with a low and constant failure rate, in order to enhance the device reliability.

On the other hand, a screening is indispensable for precluding early failures, in which devices are subjected to accelerated aging for a prescribed time period, whereby defective devices are screened out. A screen testing which ensures that the early failure rate rapidly decreases against time to enable immediate commencement of the random failure period is desirable in order to perform the screening effectively in a short time period.

Currently a high temperature operation test (burn-in test) is generally performed as a screening procedure. The burn-in test allows a direct evaluation of a dielectric film using an actual device. During the burn-in test, every defective factor including a migration of an aluminum interconnection is revealed by applying a high temperature and high-field stresses.

When the device is operated under a high temperature to enhance acceleration, the burn-in test becomes particularly effective.

FIG. 15 is a block diagram showing a configuration of a voltage down converter portion of a conventional semiconductor device adaptable for the burn-in test.

Referring to FIG. 15, the voltage down converter of the conventional semiconductor device includes: a capacitor 212 arranged between an external power supply potential Ext.Vcc and a ground potential; a capacitor 220 arranged between an internal power supply potential Int.Vcc and the ground potential; a reference voltage generation circuit 216 generating a reference potential for internal power supply potential Int.Vcc at a normal operation; a differential amplifier 218 powered by external power supply potential Ext.Vcc and setting an internal power supply potential Int.Vcc of the same level as an output voltage of reference voltage generation circuit 216; and a P channel transistor 214 having a gate receiving a burn-in mode detection signal /STR, a source coupled to external power supply potential Ext.Vcc and a drain coupled to internal power supply potential Int.Vcc.

In a normal mode other than a test mode for the reliability evaluation, burn-in mode detection signal /STR is at a logical high (H) level and P channel transistor 214 is off.

In the test mode for the reliability evaluation, burn-in mode detection signal /STR attains a logical low (L) level and a node supplied with internal power supply potential Int.Vcc and a node supplied with external power supply potential Ext.Vcc are connected together via P channel transistor 214, thus internal power supply potential Int.Vcc is rendered equal to external power supply potential Ext.Vcc.

In such a voltage down converter as the one shown in FIG. 15, however, transistor 214, which short-circuits a node receiving external power supply potential Ext.Vcc and a node receiving internal power supply potential Int.Vcc at the time of testing, must be large enough to secure the current driving capability. Such a large transistor required for the testing of semiconductor devices causes a chip area to increase.

A method for rendering internal power supply potential Int.Vcc the same level as external power supply potential Ext.Vcc using an output driving transistor included in a differential amplifier portion is disclosed in Japanese Patent Laying-Open No. 6-103793.

FIG. 16 is a circuit diagram showing a configuration of a voltage down converter disclosed in the aforementioned Japanese Patent Laying-Open No. 6-103793.

The voltage down converter shown in FIG. 16 includes: a reference voltage generation circuit 2100 for generating a reference voltage Vref; a comparator 2200 for receiving and comparing internal power supply voltage Int.Vcc and reference voltage Vref; a driver P5 controlled by comparator 2200 and pulling down external power supply voltage Ext.Vcc to the level of internal power supply voltage Int.Vcc; a burn-in reference voltage generation circuit 2300; series-connected inverters I1 and I2 receiving an output of node G3 of burn-in reference voltage generation circuit 2300 as an input; an inverter I3 receiving an output of inverter I2; an N channel transistor N4 having a gate receiving an output of inverter I3 and connecting an output node G1 of comparator 2200 and a node G2 connected to a gate of driver P5; a P channel transistor P3 having a gate receiving the output of inverter I2 and connecting node G1 and node G2; and an N channel transistor N5 having a gate receiving the output of inverter I2 and coupling node G2 with a ground potential Vss.

Comparator 2200 includes an N channel transistor N3 having a gate receiving reference voltage Vref and a source coupled to ground potential Vss, an N channel transistor N1 having a gate receiving reference voltage Vref and connecting a drain of N channel transistor N3 and node G1, an N channel transistor N2 having a gate receiving internal power supply potential Int.Vcc and a source connected to the drain of N channel transistor N3, a P channel transistor P2 having a gate receiving a drain potential of N channel transistor N2 and coupling the drain of N channel transistor N2 and external power supply potential Ext.Vcc and a P channel transistor P1 having a gate receiving a potential from the drain of N channel transistor N2 and coupling node G1 and external power supply potential Ext.Vcc.

FIG. 17 is a waveform diagram illustrating an operation of the voltage down converter shown in FIG. 16.

Referring to FIGS. 16 and 17, the voltage down converter operates normally during the time period t1–t2.

Internal power supply potential Int.Vcc is applied to each circuit block such as a memory element in a chip, as well as to the gate of N channel transistor N2 in comparator 2200.

Therefore, when internal power supply potential Int.Vcc attains lower than the potential of reference voltage Vref because of the current consumption by each circuit block such as a memory element inside a chip while the internal power supply potential Int. Vcc is supplied to the device, the potential at output node G1 of comparator 2200 is lowered.

Then driver P5 is rendered conductive, reducing the voltage drop in internal power supply potential Int.Vcc.

On the other hand, when internal power supply potential Int.Vcc attains higher than the potential of reference voltage Vref and the level of the potential at output node G1 of comparator 2200 goes higher, the voltage drop at driver P5 is increased accordingly, thereby reducing internal power supply potential Int.Vcc down to the potential of reference voltage Vref.

During the time period t1–t2, the potential at output node G3 of burn-in reference voltage generation circuit 2300 is at an L level. Accordingly, N channel transistor N4 and P channel transistor P3 are both conductive, nodes G1 and G2 are connected and N channel transistor N5 is turned OFF.

From time t2 to t3, output node G3 of burn-in reference voltage generation circuit 2300 attains an H level. In response, both N channel transistor N4 and P channel transistor P3 are turned OFF. N channel transistor N5 turns ON-state and the potential at node G2 attains an L level.

Thus driver P5 is rendered conductive, allowing external power supply potential Ext.Vcc to be applied to the chip via driver P5 with little voltage drop. At this point, output node G1 of comparator 2200 at an H level does not affect node G2 because P channel transistor P3 and N channel transistor N4 are both at an OFF-state.

In a conventional semiconductor device using a voltage down converter such as those shown in FIGS. 15 and 16, internal power supply potential Int.Vcc of one level generated by one voltage down converter is used.

In this case, in a semiconductor memory device, following problems arise, for example.

In general a memory cell array consumes a large current compared with a peripheral circuitry. To achieve reduction in power consumption, therefore, internal power supply potential Int.Vcc supplied to the memory cell array is decreased. When such a decreased internal power supply potential Int.Vcc generated by one voltage down converter is applied to the peripheral circuitry portion, however, the peripheral circuitry cannot achieve a required high-speed operation.

Meanwhile, internal power supply potential Int.Vcc can be increased in order to obtain a high-speed operation of the peripheral circuitry. In a conventional semiconductor memory device, however, an increased internal power supply potential Int.Vcc is also applied to the memory cell array because there is only one voltage down converter. The reduction of power consumption cannot be achieved if such a large internal power supply potential Int.Vcc is supplied to the memory cell array.

In a voltage down converter as shown in FIG. 16 where a transfer gate is inserted between the comparator output and the gate of the driver, the transfer gate must be large enough to ensure a sufficiently high speed response at the normal operation. This leads to increased chip area.

SUMMARY OF THE INVENTION

An object of the present invention is to provide a semiconductor device which allows an effective reliability evaluation testing and realizes the high speed operation and the reduction in power consumption.

The present invention is, to be brief, a semiconductor device including a first power supply terminal, a second power supply terminal, a control circuit and a first voltage down converter.

The first power supply terminal receives a first power supply potential. The second power supply terminal receives a second power supply potential higher than the first power supply potential. The control circuit generates a test mode signal in response to an externally applied designation. The first voltage down converter receiving the first power supply potential and the second power supply potential pulls down the second power supply potential to generate a first intermediate potential. The first voltage down converter includes a first output node, a first reference potential generation circuit generating a first reference potential which is a reference for the first intermediate potential, a first internal node receiving the second power supply potential, and a first comparison circuit receiving and comparing the first reference potential and a potential at the first output node, the first comparison circuit having a first inactivation circuit inactivating a comparison operation in response to the test mode signal, and a first drive circuit supplying a current from the first internal node to the output node in accordance with the output of the first comparison circuit at the time of inactivation of the test mode signal and connecting the first output node and the first internal node at the time of activation of the test mode signal.

An advantage of the present invention is, therefore, that an additional element for conducting an external power supply potential line and an internal power supply potential line at the time of burn-in testing is not required because an output driving P channel transistor of a voltage down converter generating an internal power supply potential can be rendered conductive, hence the required area is reduced.

A further advantage of the present invention is that the response of the voltage down converter will not be adversely affected at the time of normal operation, because the comparator itself is inactivated at the time of burn-in testing and an output of the comparator is supplied directly to a gate of the driving P channel transistor and not via a transfer gate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
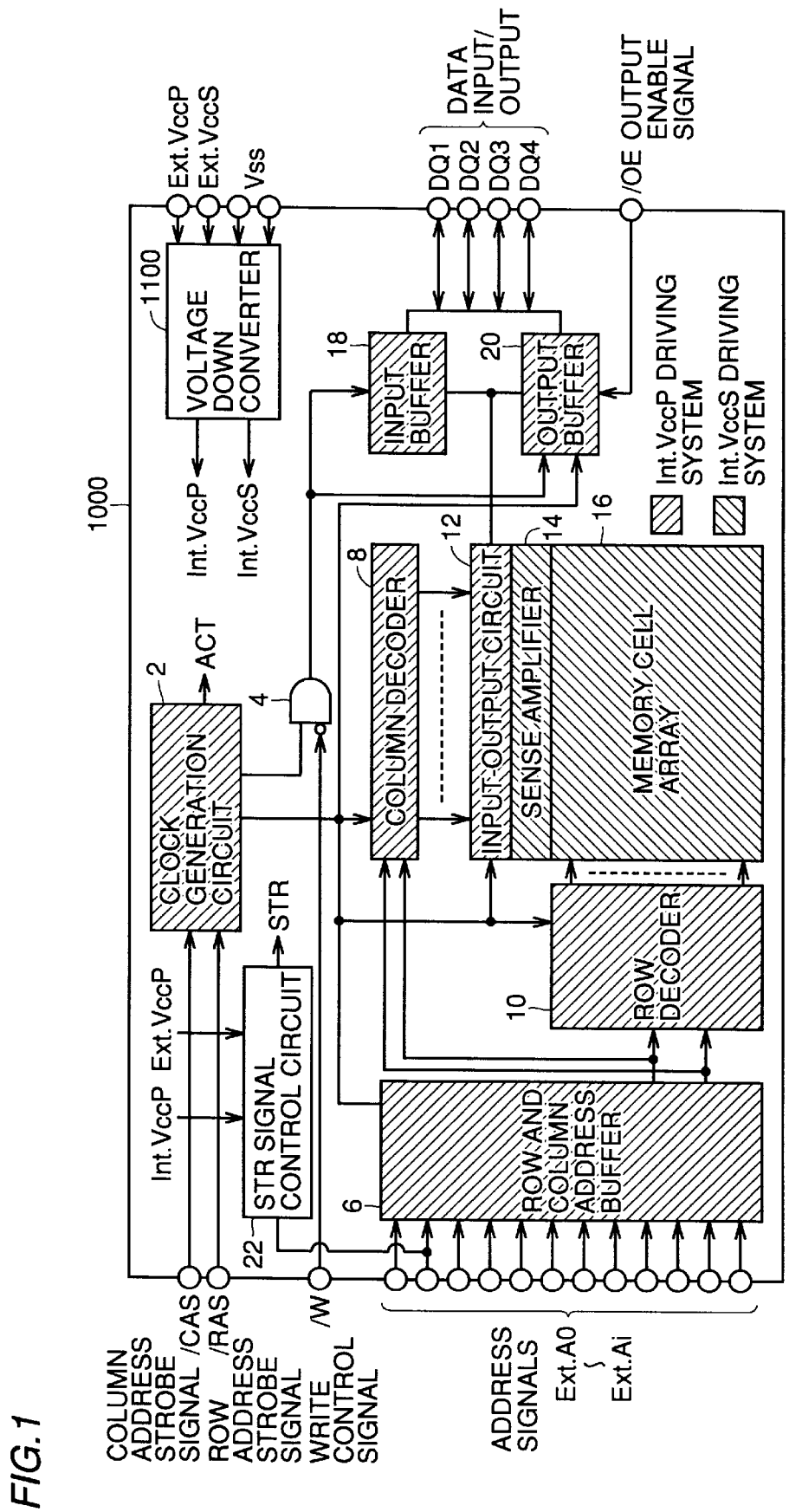
FIG. 1 is a block diagram showing a configuration of a semiconductor device 1000 in accordance with a first embodiment of the present invention.

Hereinafter embodiments of the present invention will be described in detail referring to the drawings, in which a same character refers to a same or a corresponding element.

First Embodiment

FIG. 1 is an example of the device of the invention employed in a dynamic random access memory (DRAM).

A semiconductor device 1000 includes a memory cell array 16 storing externally applied data, a row and column address buffer 6 receiving address signals Ext.A0–Ext.Ai designating an address of memory cell array 16, row decoder 10 selecting and driving one of a plurality of word lines of the memory cell array in response to a row address signal supplied from row and column address buffer 6, a column decoder 8 selecting one of a plurality of bit line pairs of memory cell array 16 in response to a column address signal supplied from row and column address buffer 6, a sense amplifier 14 amplifying a potential difference between bit line pairs of the memory cell array, an input buffer 18 receiving and amplifying externally applied input data DQ1–DQ4, an output buffer 20 externally outputting output data DQ1–DQ4 and an input-output circuit 12 connecting a bit line pair selected by the column decoder to the input buffer and the output buffer.

Input-output circuit 12 supplies the potential of a bit line pair selected by column decoder 8 to output buffer 20. Output buffer 20 amplifies the supplied potential to externally output as data DQ1–DQ4. Input buffer 18 amplifies externally input data DQ1–DQ4. Input-output circuit 12 supplies data amplified at input buffer 18 to a bit line pair selected by column decoder 8. Row and column address buffer 6 selectively supplies externally supplied address signals Ext.A0–Ext.Ai to row decoder 10 and column decoder 8.

Semiconductor device 1000 further includes a clock generation circuit 2 generating an operation timing for an internal circuit in response to a column address strobe signal /CAS and a row address strobe signal /RAS, a gate circuit 4 activating/inactivating the input buffer and output buffer in accordance with the value of a write control signal /W, a voltage down converter 1100 receiving external power supply potentials Ext.VccP and Ext.VccS and a ground voltage Vss and generating internal power supply potentials Int.VccP and Int.VccS, and an STR signal control circuit 22 receiving internal power supply potential Int.VccP, external power supply potential Ext.VccP and an address signal and generating a burn-in mode detection signal STR.

As shown by a hatched region in FIG. 1, internal power supply potential Int.VccS of the level lower than that of internal power supply potential Int.VccP is supplied to memory cell array 16, sense amplifier 14 and input-output circuit 12 in order to reduce current consumption. Meanwhile internal power supply potential Int.VccP is applied to row decoder 10, column decoder 8, input-output circuit 12, row and column address buffer 6, input buffer 18 and output buffer 20 in order to achieve a high speed operation.

Figure 2:
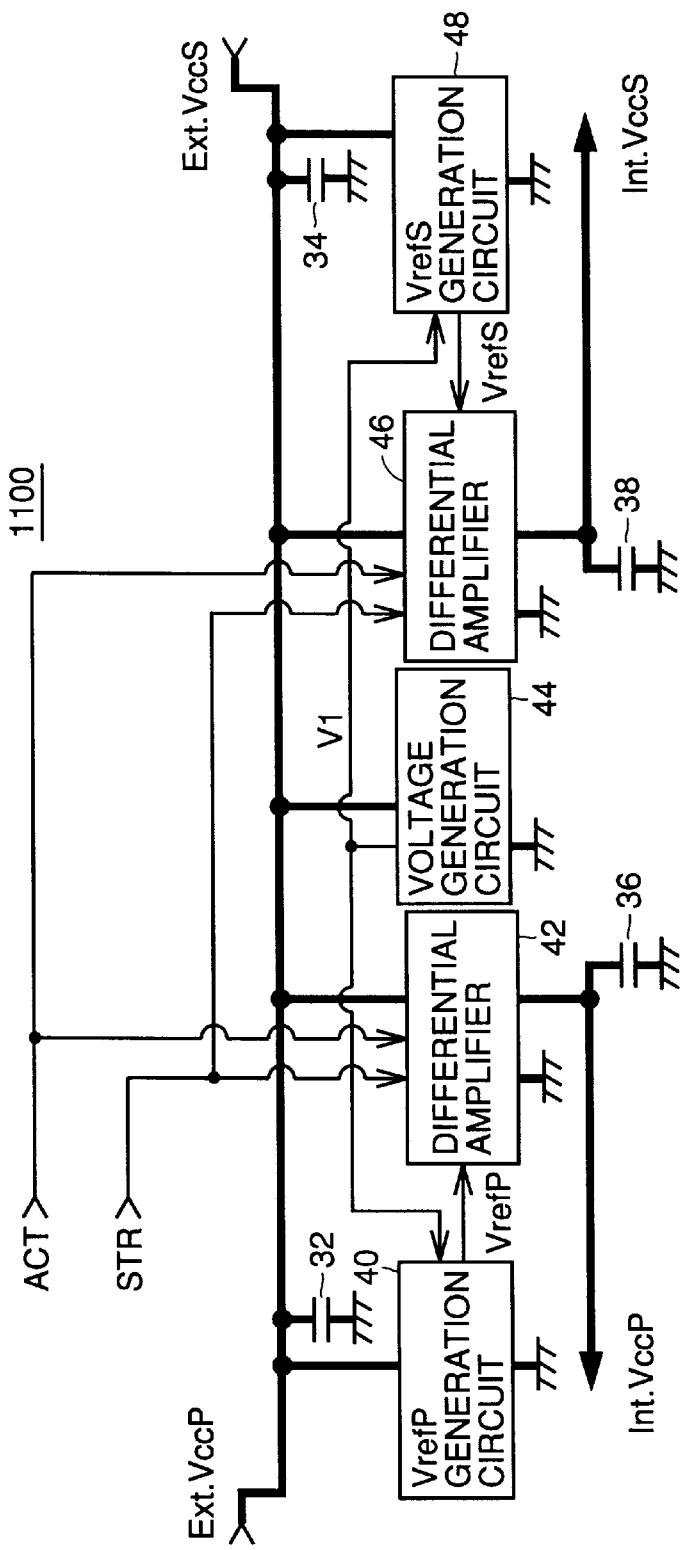
FIG. 2 is a schematic block diagram showing a configuration of a voltage down converter 1100 shown in FIG. 1.

Referring to FIG. 2, voltage down converter 1100 includes: a capacitor 32 coupling external power supply potential Ext.VccP and the ground potential; a capacitor 36 coupling internal power supply potential Int.VccP and the ground potential; a capacitor 34 coupling external power supply potential Ext.VccS and the ground potential; a capacitor 38 coupling internal power supply potential Int.VccS and the ground potential; a voltage generation circuit 44 generating a standard potential V1 in response to the internal power supply potential and the ground potential; a VrefP generation circuit 40 generating a reference potential VrefP in response to external power supply potential Ext.VccP, the ground potential and standard potential V1; a differential amplifier 42 receiving reference potential VrefP and outputting internal power supply potential Int.VccP in accordance with settings of burn-in mode detection signal STR and an activation signal ACT; a VrefS generation circuit 48 generating reference potential VrefS in response to external power supply potential Ext.VccS, the ground voltage and standard potential V1; and a differential amplifier 46 receiving reference voltage VrefS to generate internal power supply potential Int.VccS in accordance with the settings of burn-in mode detection signal STR and activation signal ACT.

In this configuration, external power supply potential Ext.VccP and Ext.VccS are generally externally supplied same potential and are mutually connected in the semiconductor device.

Figure 3:
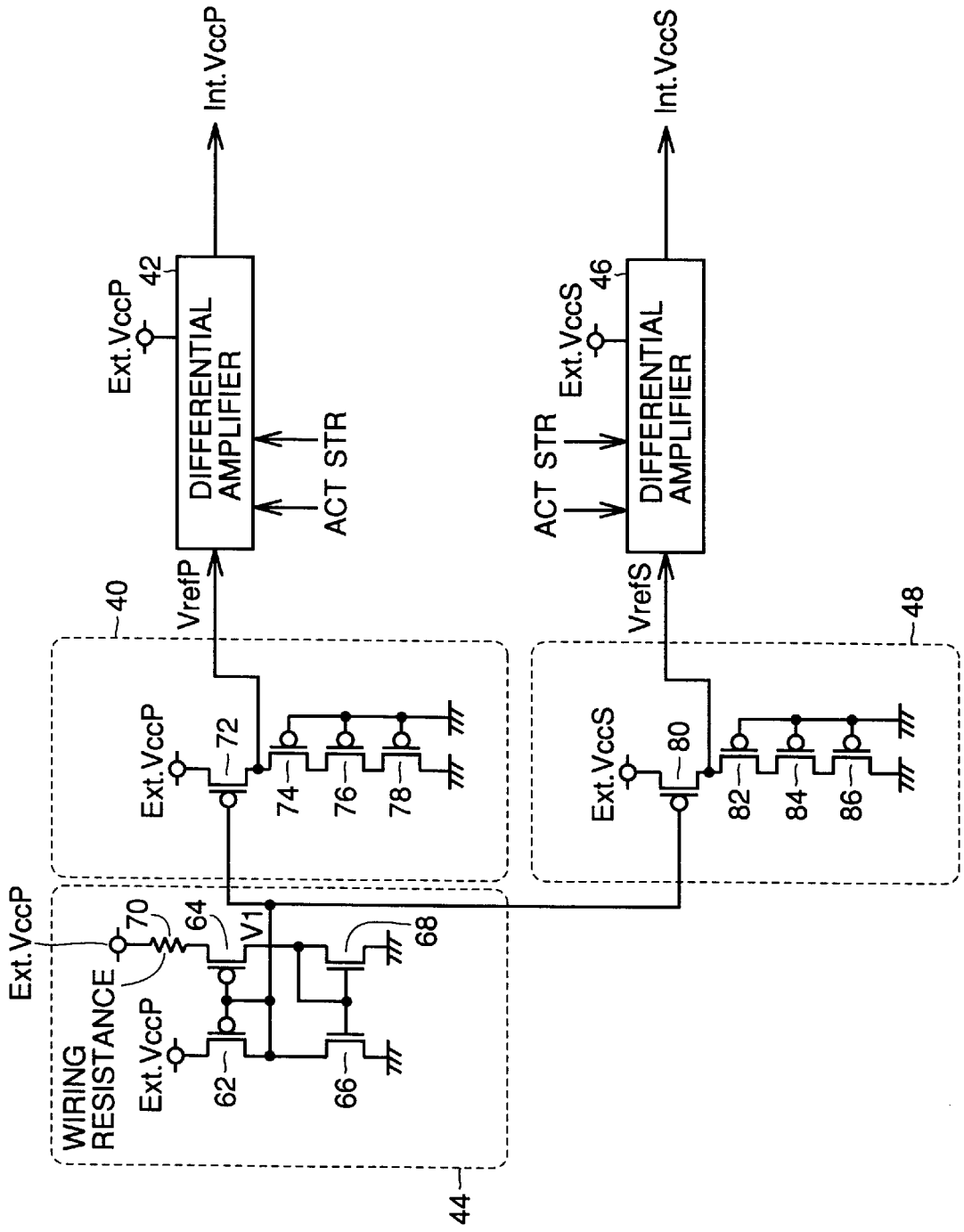
FIG. 3 is a circuit diagram showing details of configurations of a VrefP generation circuit 40, a VrefS generation circuit 48 and a voltage generation circuit 44 shown in FIG. 2.

Referring to FIG. 3, voltage generation circuit 44 includes an N channel transistor 68 having a source coupled with the ground potential and a gate and a drain connected together, an N channel transistor 66 having a source coupled to the ground potential and a gate receiving a potential of the drain of N channel transistor 68, a P channel transistor 62 having a source receiving external power supply potential Ext.VccP and a gate and a drain coupled with a drain of N channel transistor 66, a P channel transistor 64 having a gate receiving a potential of the drain of N channel transistor 66 and a drain connected to the drain of N channel transistor 68, and a resistor 70 coupling external power supply potential Ext.VccP and a source of P channel transistor 64.

The potential of the drain of N channel transistor 66 is at the level of standard potential V1.

VrefP generation circuit 40 includes a P channel transistor 72 having a gate receiving standard potential V1 and a source coupled with external power supply potential Ext.VccP and series-connected P channel transistors 74, 76 and 78 having their respective gates coupled with the ground potential and coupling a drain of P channel transistor 72 and the ground potential.

The potential at the drain of P channel transistor 72 is at the level of reference potential VrefP.

Differential amplifier 42 receives reference potential VrefP to generate internal power supply potential Int.VccP.

VrefS generation circuit 48 includes a P channel transistor 80 having a gate receiving standard potential V1 and a source coupled with external power supply voltage Ext.VccS and series connected P channel transistors 82, 84 and 86 having their respective gates coupled with the ground potential and coupling a drain of P channel transistor 80 and the ground potential.

The potential at the drain of P channel transistor 80 is at the level of reference potential VrefS.

Differential amplifier 46 receives reference potential VrefS to generate internal power supply potential Int.VccS.

Operations of VrefP generation circuit 40, VrefS generation circuit 48 and voltage generation circuit 44 will be described hereinafter.

First by the input of standard potential V1 generated by voltage generation circuit 44 to gates of P channel transistors 72 and 80, a constant current with little dependency on the external power supply potential is generated at P channel transistors 72 and 80, respectively. The constant current is converted to reference voltages VrefP and VrefS respectively by the channel resistances of P channel transistors 74–78 and 82–86.

Differential amplifier 46 must generate a voltage lower than that generated by differential amplifier 42 because internal power supply potential Int.VccP is supplied to the peripheral circuitry whereas internal power supply potential Int.VccS is supplied to the memory cell array. The level of internal power supply potential Int.VccS generated by differential amplifier 46 is made lower than the level of internal power supply potential Int.VccP generated by differential amplifier 42 by setting the value of channel resistances of P channel transistors 82–86 lower than that of P channel transistors 74–78, thereby making reference potential VrefS lower than VrefP.

Figure 4:
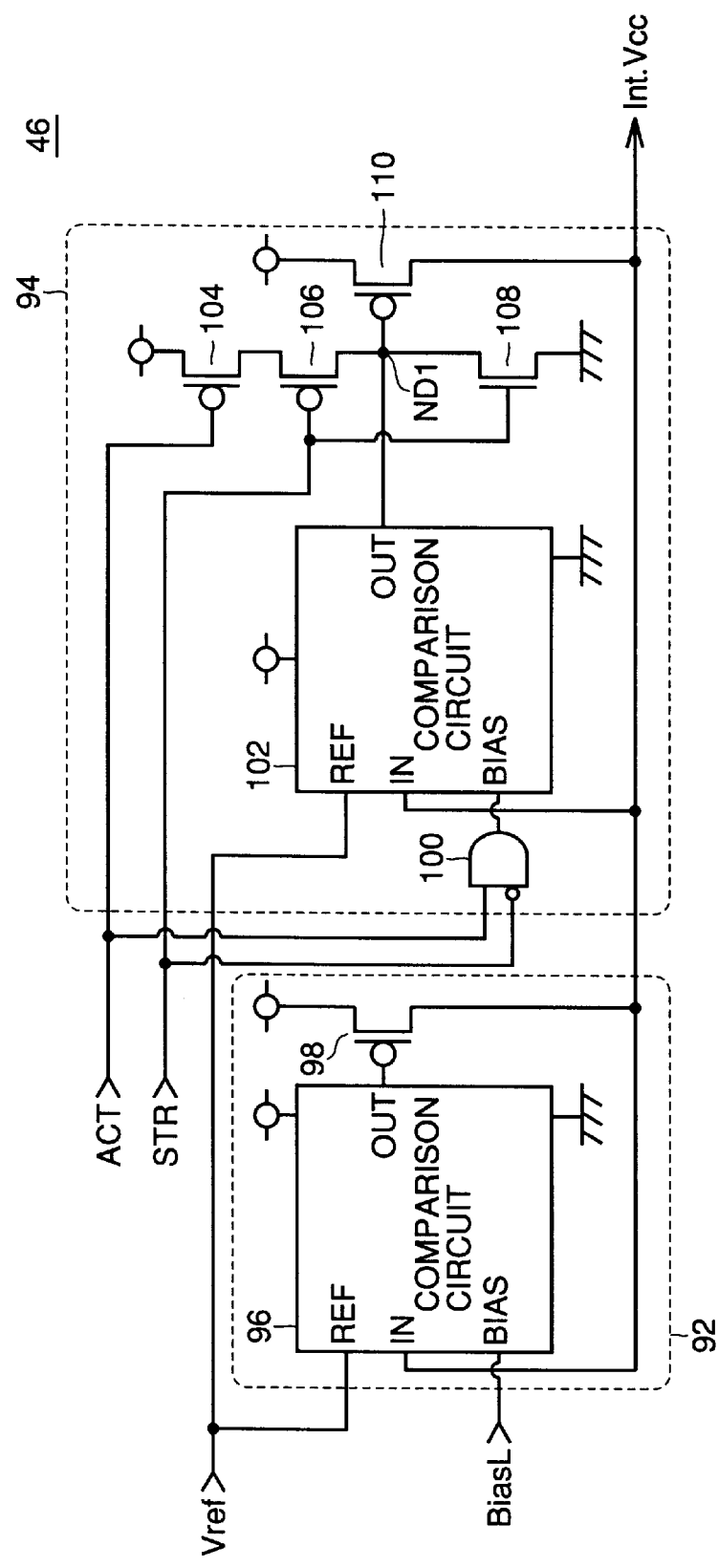
FIG. 4 is a circuit diagram showing details of a configuration of a differential amplifier 46 shown in FIG. 2.

FIG. 4 is a circuit diagram showing details of a configuration of differential amplifier 46 shown in FIG. 2. A configuration of differential amplifier 42 shown in FIG. 2 is the same.

Referring to FIG. 4, differential amplifier 46 includes a STAND-BY amplifier 92 and an ACTIVE amplifier 94.

STAND-BY amplifier 92 includes a comparator 96 comparing internal power supply potential Int.Vcc and reference potential Vref, and a P channel transistor 98 having a gate receiving an output of comparator 96 and coupling external power supply potential Ext.Vcc and internal power supply potential Int.Vcc. Comparator 96 also receives a bias potential BiasL determining an operating current of comparator 96.

ACTIVE amplifier 94 includes a comparator 102 comparing internal power supply potential Int.Vcc and reference potential Vref to output the result to a node ND1, a gate circuit 100 receiving activation signal ACT and burn-in mode detection signal STR, an N channel transistor 108 having a gate receiving burn-in mode detection signal STR and coupling node ND1 and the ground potential, a P channel transistor 106 having a gate receiving burn-in mode detection signal STR and a drain connected to node ND1, a P channel transistor 104 having a gate receiving activation signal ACT and coupling a source of P channel transistor 106 and the external power supply potential, and a P channel transistor 110 having a gate connected to node ND1 and coupling external power supply potential Ext.Vcc and internal power supply potential Int.Vcc. When activation signal ACT is at an active state and burn-in mode detection signal STR is at an inactive state, gate circuit 100 supplies an activation signal to comparator 102.

When no external data access is made, that is, when activation signal ACT is at an L level, the ACTIVE amplifier is at an inactive state in differential amplifier 46. Therefore, the internal power supply potential is generated only by STAND-BY amplifier 92. At the time of external data access, that is, when activation signal ACT is at an H level, ACTIVE amplifier 94 is activated thereby increasing the current supplying capability of differential amplifier 46.

At the time of burn-in test, burn-in detection signal STR attaining an H level causes ACTIVE amplifier 94 to supply an external power supply potential as an internal power supply potential.

At this time P channel transistor 98 in STAND-BY amplifier 92 is turned off, although no adverse effect on its operation will be induced.

Figure 5:
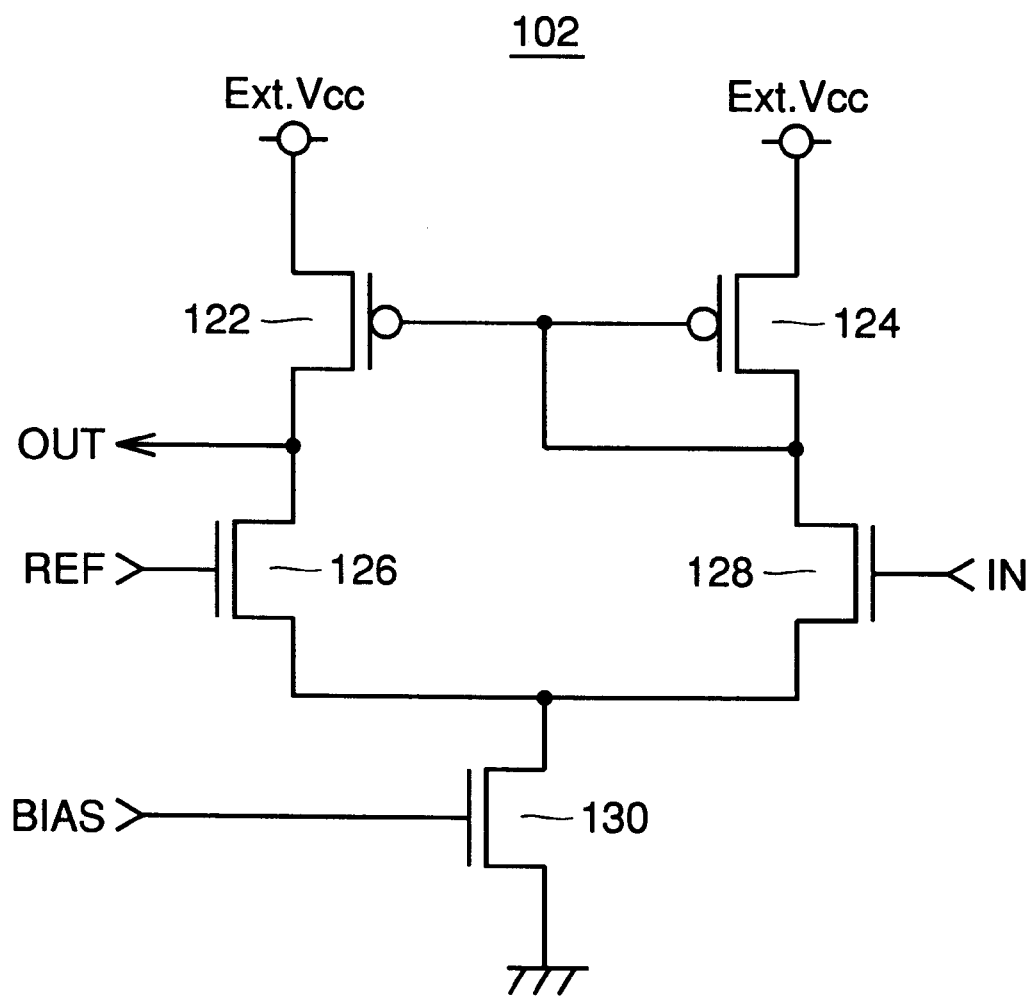
FIG. 5 is a circuit diagram showing details of a configuration of a comparison circuit 102 shown in FIG. 4.

Referring to FIG. 5, comparator 102 includes an N channel transistor 130 having a source coupled to the ground potential and a gate receiving a bias signal BIAS, an N channel transistor 128 having a gate receiving an input signal IN and a source connected to a drain of N channel transistor 130, a P channel transistor 124 having a source coupled to the external power supply potential and a gate and a drain connected to a drain of N channel transistor 128, an N channel transistor 126 having a gate receiving a reference signal REF and a source connected to the drain of N channel transistor 130, and a P channel transistor 122 having a gate receiving a potential of the drain of N channel transistor 128 and coupling external power supply potential Ext.Vcc and a drain of N channel transistor 126. The potential of the drain of N channel transistor 126 is an output signal OUT.

Figure 6:
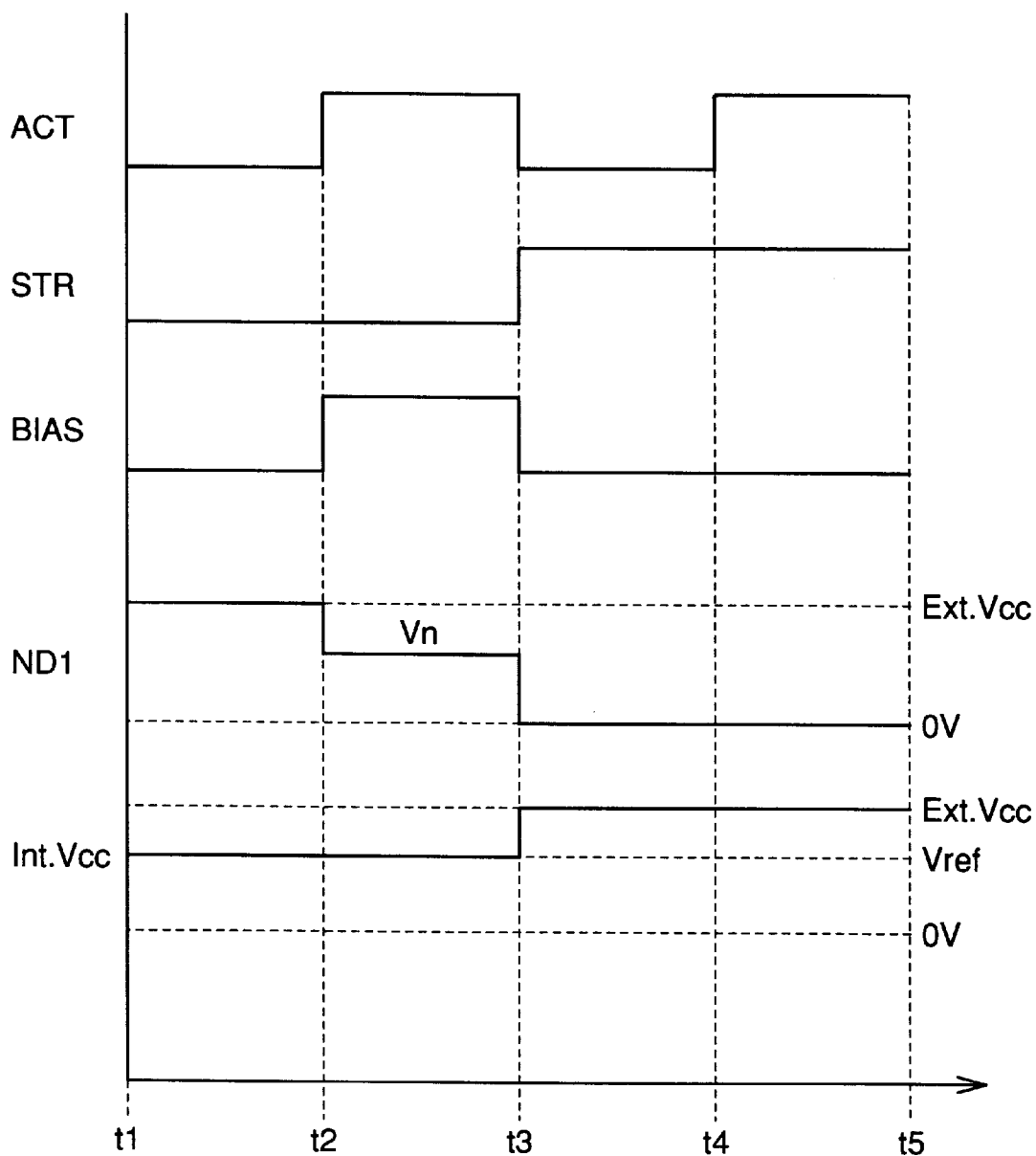
FIG. 6 is a waveform diagram illustrating an operation of differential amplifier 46 of FIG. 4.

With reference to FIGS. 4, 5 and 6, during the time period t1–t2, activation signal ACT is at an L level, because the current consumption of the semiconductor device is low due to the absence of external access, for example. Burn-in mode detection signal STR is also at an L level because the device is at the normal operation. In this state, an output of gate circuit 100 is at an L level to inactivate comparator 102. P channel transistors 104 and 106 receive a signal of an L level at their respective gates thereby pulling up the level at node ND1 to an H level. A signal of an L level is also supplied to a gate of N channel transistor 108 thereby rendering N channel transistor 108 nonconductive. Thus the potential of an H level is established at node ND1 and the gate potential of P channel transistor 110 is at an H level, leading to the inactivation of P channel transistor 110 and thereby inactivating ACTIVE amplifier 94. Under this circumstance, internal power supply potential Int.Vcc is held at the level of reference potential Vref by the STAND-BY amplifier.

Then during the time period t2–t3, activation signal ACT attains an H level because of the external access to the semiconductor device, for example. In response to the transition of the signal, gate circuit 100 pulls up the level of bias signal BIAS from an L level to an H level thereby activating comparator 102. At the same time activation signal ACT of an H level renders P channel transistor 104 nonconductive. Therefore, the potential at node ND1 is determined by an output of comparator 102. As P channel transistor 110 supplies a current to a node receiving internal power supply potential Int.Vcc in accordance with the current consumption of the internal circuit, the internal power supply potential Int.Vcc is maintained.

ACTIVE amplifier 94 is designed to have a larger current drivability and to achieve a high speed operation compared with STAND-BY amplifier 92.

From time t3 to t5, burn-in mode detection signal STR is shown to have an H level for the burn-in test. In this state, gate circuit 100 outputs the bias signal of an L level, thereby rendering comparator 102 inactive, P channel transistor 106 nonconductive, and N channel transistor 108 conductive. In response, the potential at node ND1 is pulled down to an L level changing the state of P channel transistor 110 to be conductive thereby making the level of internal power supply potential Int.Vcc equal to that of external power supply potential Ext.Vcc. Activation signal ACT does not affect the operation of ACTIVE amplifier 94.

It is necessary to render the level of internal power supply potential Int.Vcc equal to that of external power supply potential Ext.Vcc by rendering P channel transistor 110 conductive, because a sufficiently high voltage required for the operation of reliability test of the internal circuit cannot be supplied to the internal circuit at the time of a normal operation of voltage down converter 46 where external power supply potential Ext.Vcc is pulled down to a prescribed internal power supply potential Int.Vcc.

Figure 7:
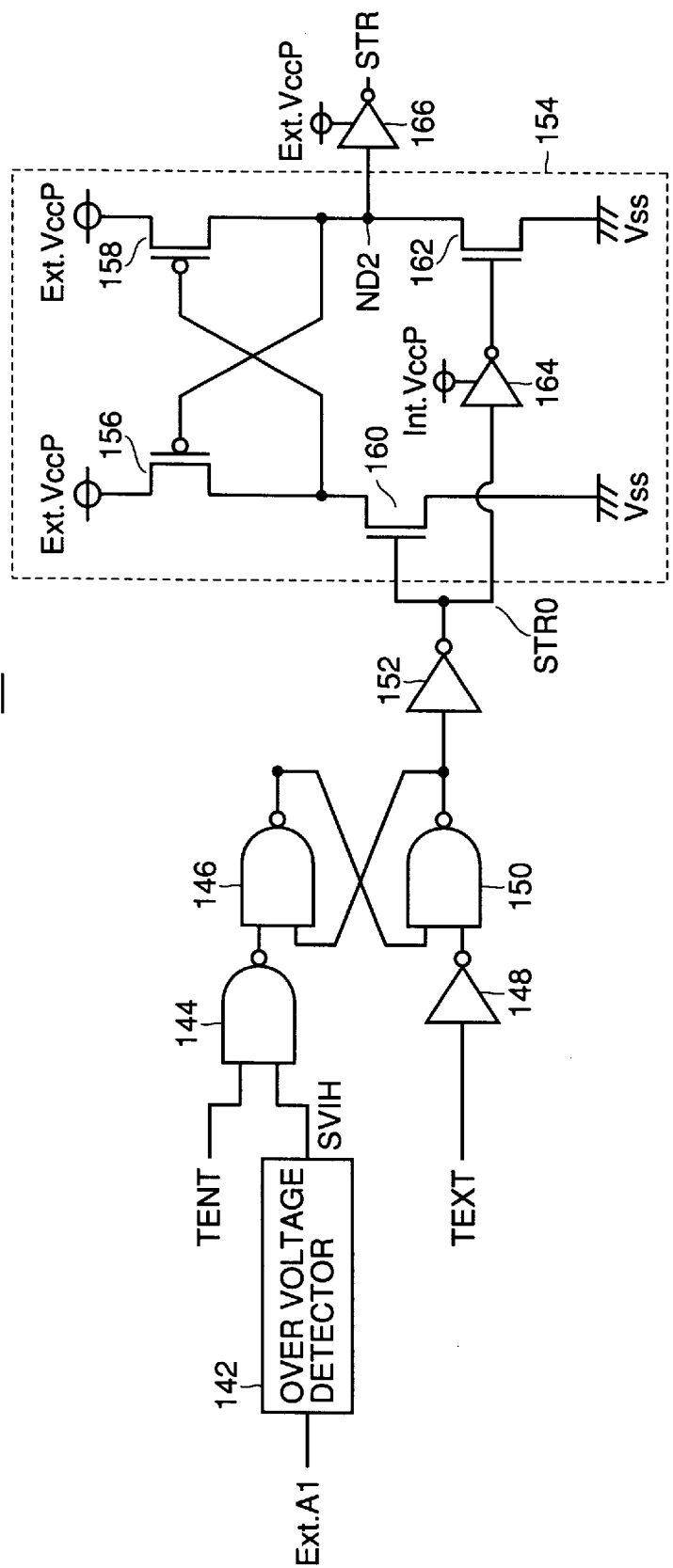
FIG. 7 is a circuit diagram showing details of a configuration of a STR signal control circuit 22 shown in FIG. 1.

Referring to FIG. 7, STR signal control circuit 22 includes an over voltage detector 142 receiving address signal Ext.A1 input to a particular address pin, an NAND circuit 144 receiving an output signal SVIH of over voltage detector 142 SVIH and a test mode start signal TENT, an inverter 148 receiving a test mode end signal TEXT, an NAND circuit 146 receiving an output of NAND circuit 144, an NAND circuit 150 receiving outputs of NAND circuit 146 and of inverter 148, an inverter 152 receiving an output of NAND circuit 150, a level shift circuit 154 and an inverter 166 receiving an output of level shift circuit 154. In addition, NAND circuit 146 receives an output of NAND circuit 150.

Inverter 152 outputs a signal STR0 and inverter 166 outputs burn-in mode detection signal STR.

Level shift circuit 154 includes an N channel transistor 160 having a gate receiving signal STR0 and a source coupled to ground potential Vss, an inverter 164 receiving signal STR0, an N channel transistor 162 having a gate receiving an output of inverter 164 and a source coupled to ground potential Vss, a P channel transistor 156 having a gate receiving the potential at a drain of N channel transistor 162 and coupling a drain of N channel transistor 160 and external power supply potential Ext.VccP and a P channel transistor 158 having a gate receiving the potential at the drain of N channel transistor 160 and coupling the drain of N channel transistor 162 and external power supply potential Ext.VccP.

Figure 8:
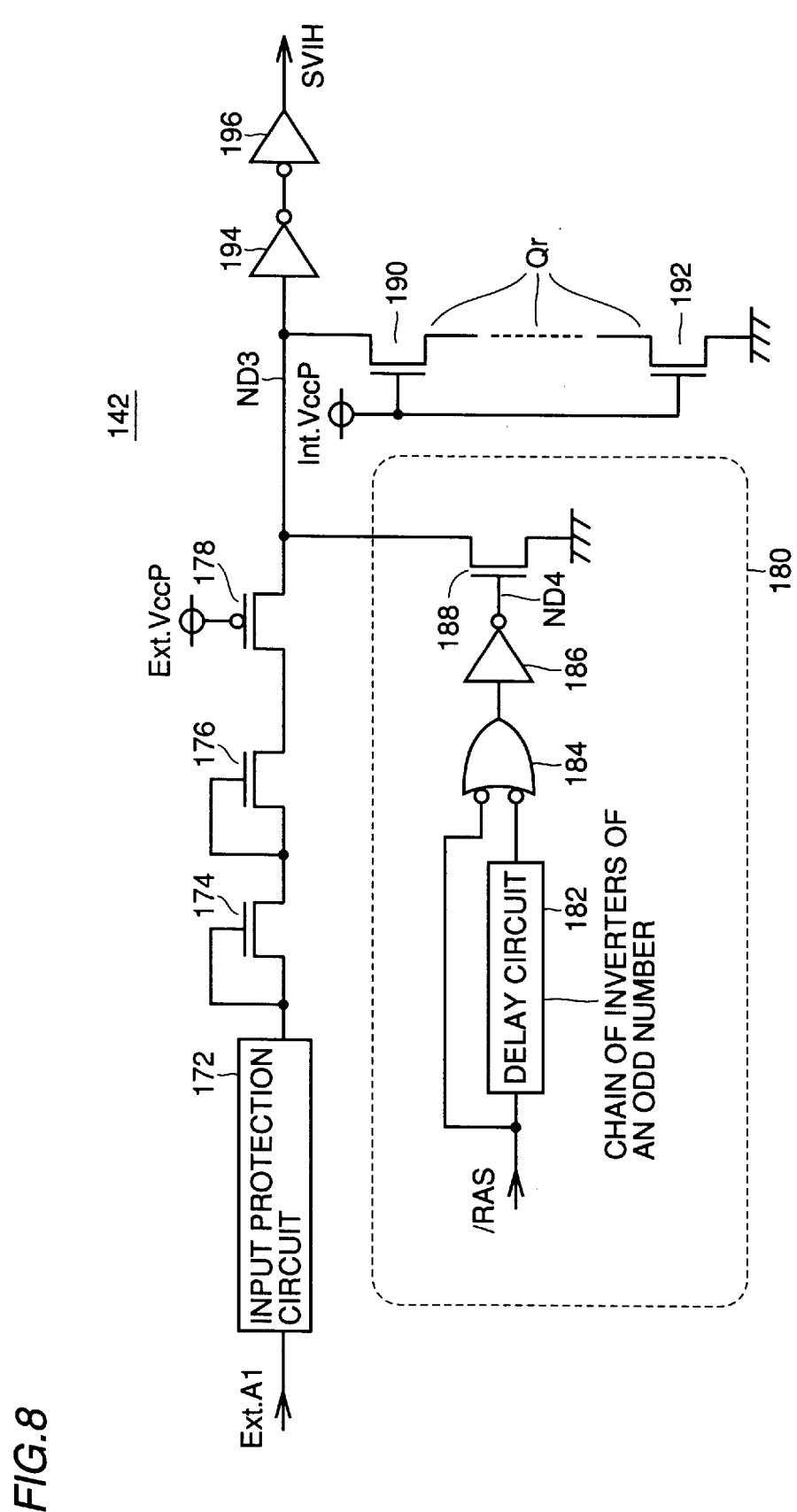
FIG. 8 is a circuit diagram showing details of a configuration of an over voltage detector 142 shown in FIG. 7.

With reference to FIG. 8, over voltage detector 142 includes an input protection circuit 172 receiving address signal Ext.A1, an N channel transistor 174 having a gate and a drain receiving an output of input protection circuit 172, an N channel transistor 176 having a gate and a drain connected to a source of N channel transistor 174, a P channel transistor 178 having a gate receiving external power supply potential Ext.VccP and connecting a source of N channel transistor 176 and a node ND3, series-connected inverters 194 and 196 receiving the potential of node ND3, series-connected N channel transistors 190–192 having respective gates receiving internal power supply potential Int.VccP and coupling node ND3 and the ground potential and a reset circuit 180 resetting the potential at node ND3 to an L level. Reset circuit 180 includes a delay circuit 182 receiving row address strobe signal /RAS, an NAND circuit 184 receiving row address strobe signal /RAS and an output of delay circuit 182, an inverter 186 receiving an output of NAND circuit 184 and an N channel transistor 188 having a gate receiving an output of inverter 186 and coupling node ND3 and the ground potential. Delay circuit 182 includes a chain of inverters of an odd number for example.

Figure 9:
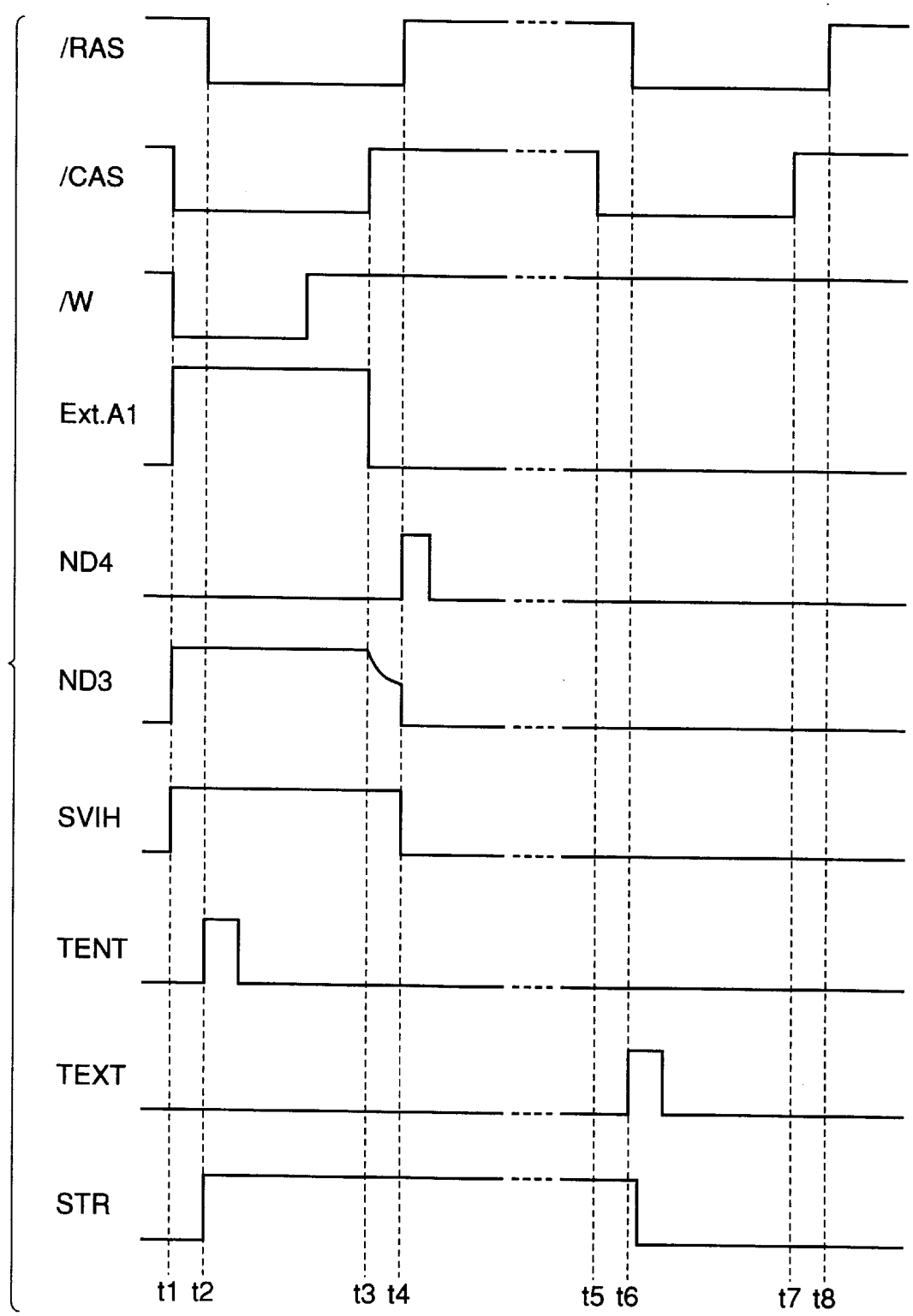
FIG. 9 is a waveform diagram shown to describe an operation of over voltage detector 142 of FIG. 8.

Referring to FIGS. 8 and 9, at the time t1 in a normal operation, the level at node ND3 is maintained at an L level by N channel transistors 190–192 provided as resistance. The resistance of N channel transistors 190–192 is high in order to suppress the current consumption. The level of signal SVIH is hence normally maintained at an L level.

At the time t2, in response to an overvoltage input to an external address pin, the potential of address signal Ext.A1 is pulled up. When the potential is increased by the prescribed potential determined by the threshold values of N channel transistors 174 and 176 and P channel transistor 178 relative to external power supply potential Ext.VccP, the potential of node ND3 attains an H level.

Then at the time t3, a pulse is generated in test mode start signal TENT when row address strobe signal /RAS falls while write control signal /W and column address strobe signal /CAS are at an L level. Then an output of NAND circuit 144 is turned to an L level for an instant because signal SVIH is at an H level, thereby inverting data in a latch circuit including NAND circuits 146 and 150. Thus burn-in detection signal STR attains an H level.

Then at the time t4, address signal Ext.A1 falls down to an L level. In response, P channel transistor 178 is turned off, and the potential at node ND3 starts falling down because of N channel transistors 190–192 having a high channel resistance.

In addition, at the time t4, a pulse generated at node ND4 by the transition of row address strobe signal /RAS to an H level turns N channel transistor 188 on, thereby pulling down the potential at node ND3 to an L level.

Burn-in test is performed during the time period t4–t5.

When column address strobe signal /CAS falls at the time t5 and then row address strobe signal /RAS falls at the time t6, test mode end signal TEXT attains an H level for an instant inverting the signal held by the latch circuit including NAND circuits 146 and 150, resulting in the transition of burn-in mode detection signal STR from an H level to an L level.

The use of over voltage detector 142 shown in FIG. 8 allows the detection of burn-in mode without the requirement of an additional external pin dedicated for the test, as mentioned above.

In FIG. 9, test mode start signal TENT is generated at WCBR (/W, /CAS before /RAS) timing and test mode end signal TEXT is generated at CBR (/CAS before /RAS) timing. It is shown only as an example and various other methods of generation are conceivable.

In the semiconductor device of the first embodiment, as described above, the response of the differential amplifier during the normal operation is not affected because the transfer gate is not inserted into the comparator output in the differential amplifier. It is advantageous because the elimination of the transfer gate saves the area. Thus an effective burn-in test can be performed realizing the reduction in current consumption and the fast operation of the semiconductor device at the same time.

Second Embodiment

Figure 10:
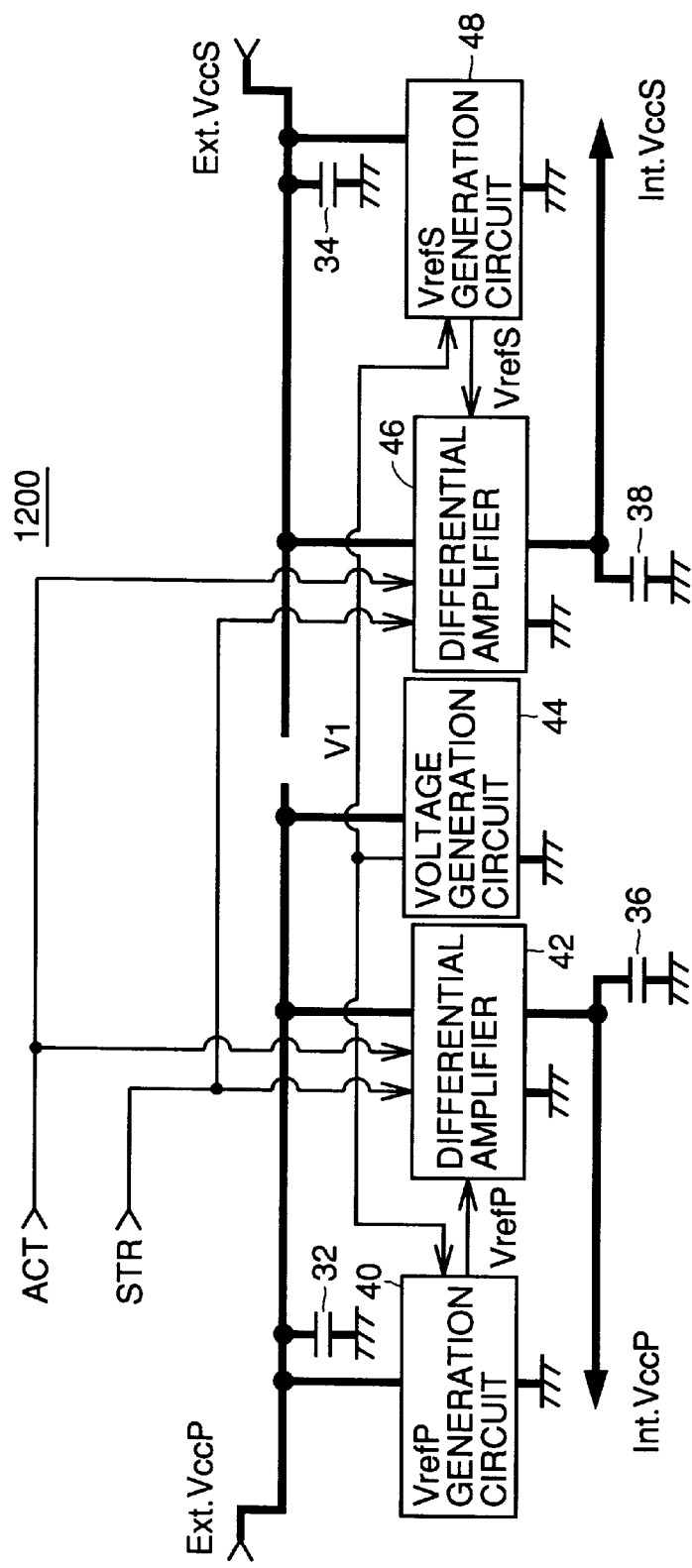
FIG. 10 is a schematic block diagram showing a configuration of a voltage down converter 1200 used in a second embodiment.

FIG. 10 is a circuit diagram showing a configuration of a voltage down converter 1200 used in place of voltage down converter 1100 in a semiconductor device according to a second embodiment.

The semiconductor device of the second embodiment is different from the semiconductor device of the first embodiment in that the device includes a voltage down converter of which internal configuration is modified from that of voltage down converter 1100 shown in FIG. 2.

Referring to FIG. 10, voltage down converter 1200 is different from voltage down converter 1100 in that node supplied with external power supply potential Ext.VccP is separated from a node supplied with external power supply potential Ext.VccS, that VrefP generation circuit 40, differential amplifier 42 and voltage generation circuit 44 are powered from external power supply potential Ext.VccP, and that differential amplifier 46 and VrefS generation circuit 48 are powered from external power supply potential Ext.VccS.

In voltage down converter 1100 used in the first embodiment, external power supply potential Ext.VccP and external power supply potential Ext.VccS are always at the same potential and are supplied to the same internal node. Therefore in the burn-in mode, internal power supply potential Int.VccS for the operation of the memory cell array and internal power supply potential Int.VccP for the operation of the peripheral circuitry are at the same level. That is, at the burn-in mode, the same power supply potential is applied to both of the memory cell array and the peripheral circuitry which should essentially operate at the different voltages.

In voltage down converter 1200 used in the second embodiment, separate nodes supplied with external power supply potential are provided for the memory cell array and for the peripheral circuitry. Thus in the burn-in mode, external power supply potential Ext.VccP and external power supply potential Ext.VccS can independently be supplied to the peripheral circuitry and to the memory cell array. Therefore the burn-in test can be performed maintaining the difference in the level of the internal power supply voltage for the memory cell array and for the peripheral circuitry. In addition, test conditions for the memory cell array and for the peripheral circuitry can independently be modified.

Third Embodiment

Figure 11:
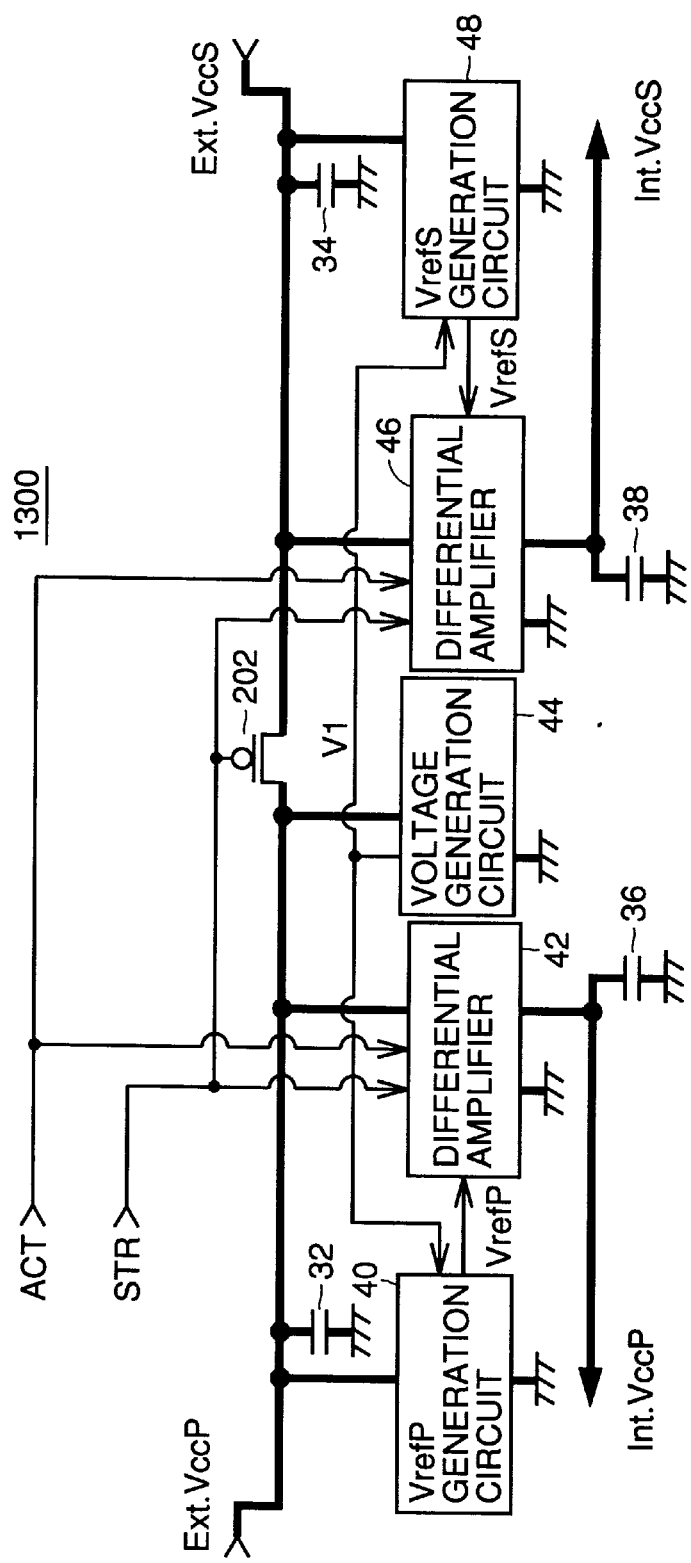
FIG. 11 is a schematic block diagram showing a configuration of a voltage down converter 1300 used in a third embodiment.

FIG. 11 is a circuit diagram showing a configuration of a voltage down converter 1300 used in place of voltage down converter 1200 in the semiconductor device of the third embodiment.

The semiconductor device according to the third embodiment is different from the semiconductor device of the second embodiment in that the configuration of voltage down converter has changed from that of voltage down converter 1200 shown in FIG. 10.

Referring to FIG. 11, voltage down converter 1300 is different from the voltage down converter 1200 in that a node supplied with external power supply potential Ext.VccP and a node supplied with external power supply potential Ext.VccS are connected by a P channel transistor 202.

Burn-in detection signal STR is supplied to a gate of P channel transistor 202.

In the second embodiment, external power supply potentials Ext.VccP and Ext.VccS can be supplied respectively to the memory cell array and the peripheral circuitry. It is desirable however to connect nodes supplied with external power supply potential in the semiconductor device, in order to ensure the reliability of the semiconductor device.

When a surge, such as a static electricity, is accidentally applied to a power supply pad of the semiconductor device, the relaxation of high electric field can be attained more effectively by expanding the region receiving the high voltage caused by a surge, if the nodes receiving external power supply potential are integrally connected inside the semiconductor device. When external power supply potential Ext.VccP attains a high potential for an instant because of a surge, the relaxation of the electric field can be performed by capacitor 34 coupled to external power supply potential Ext.VccS, for example.

In the burn-in mode, the burn-in test can be performed as in the case of semiconductor device shown in the second embodiment, while maintaining the difference between internal power supply potentials for the memory cell array and for the peripheral circuit at the time of normal operation. In addition, it is possible to independently change the test conditions for the memory cell array and for the peripheral circuitry.

Fourth Embodiment

In the semiconductor device according to the fourth embodiment, a voltage down converter 2000 is used in place of voltage down converter 1100. Voltage down converter 2000 is different from voltage down converter 1100 in that a differential amplifier 1400 is used in place of differential amplifier 46 generating internal power supply potential Int.VccS.

Differential amplifier 1400 is different from differential amplifier 46 described in the first embodiment in that a source of N channel transistor 108 is coupled with internal power supply potential Int.Vcc.

Figure 13:
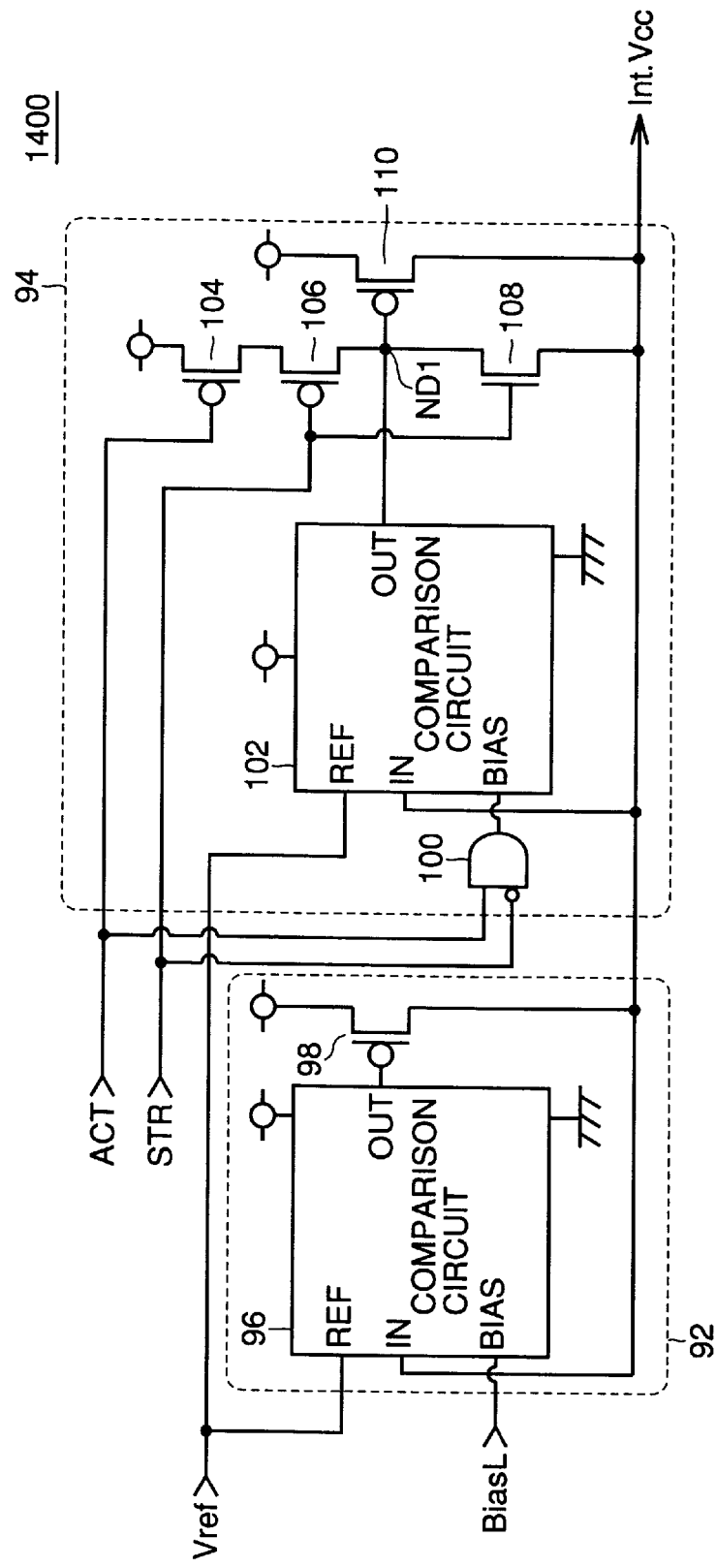
FIG. 13 is a circuit diagram showing details of a configuration of a differential amplifier 1400 of FIG. 12.

Otherwise configuration of differential amplifier 1400 is the same as that of differential amplifier 46 used in semiconductor device 1000 described in the first embodiment, therefore the same elements shown in FIG. 13 are designated by the same reference characters and description will not be repeated.

Figure 12:
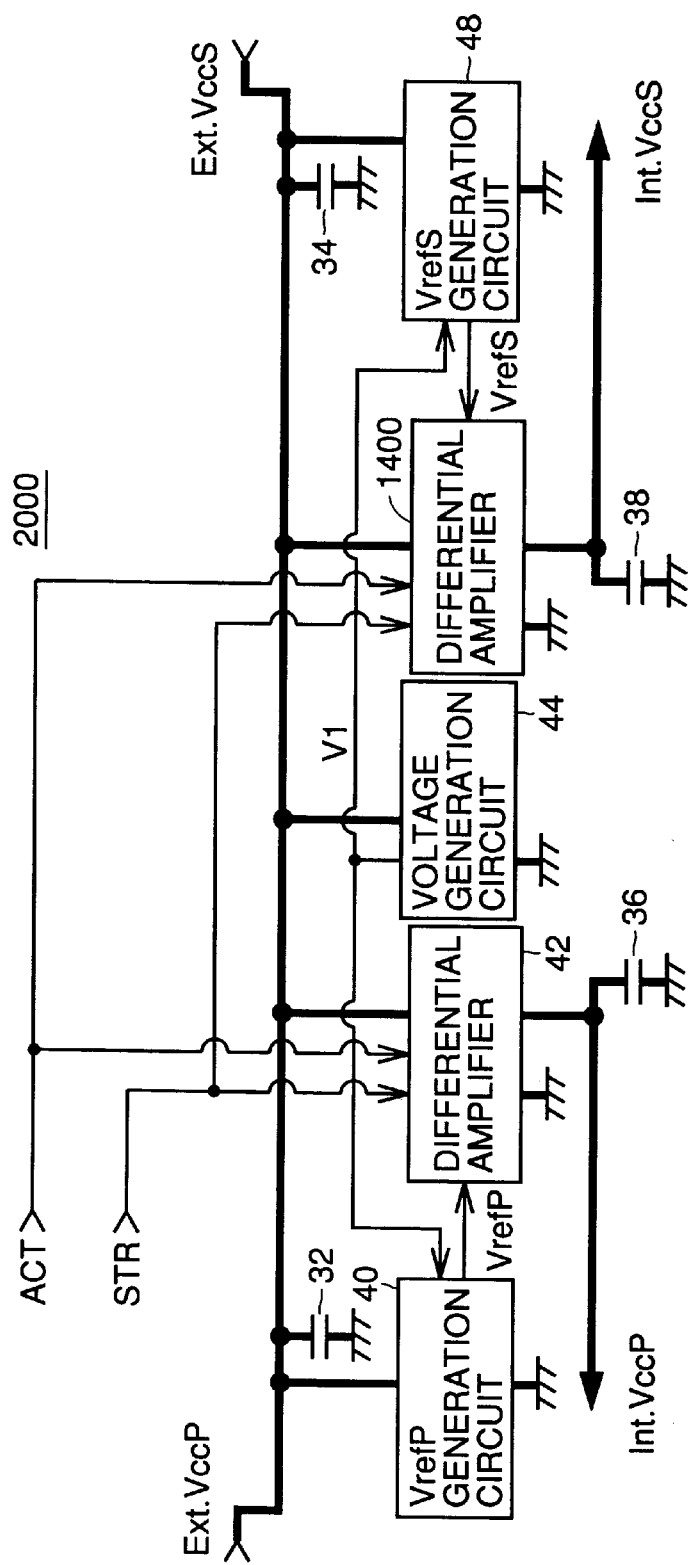
FIG. 12 is a schematic block diagram showing details of a configuration of a voltage down converter 2000 used in a fourth embodiment.
Figure 14:
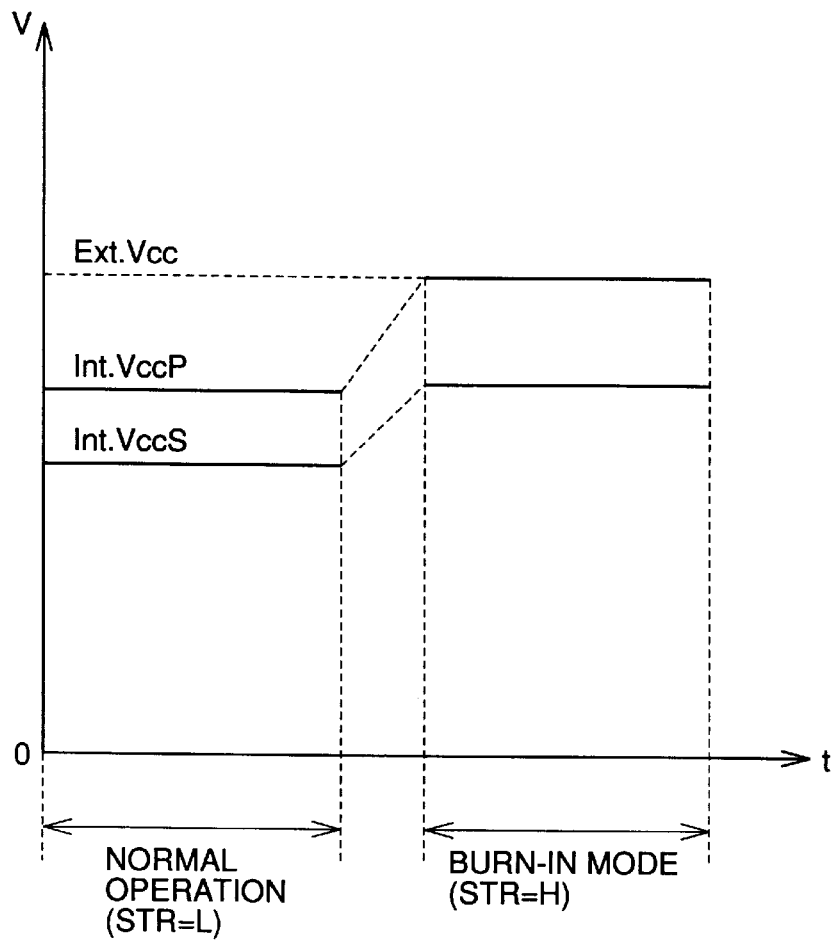
FIG. 14 is a diagram illustrating an operation of voltage down converter 2000 of FIG. 12.
Figure 15:
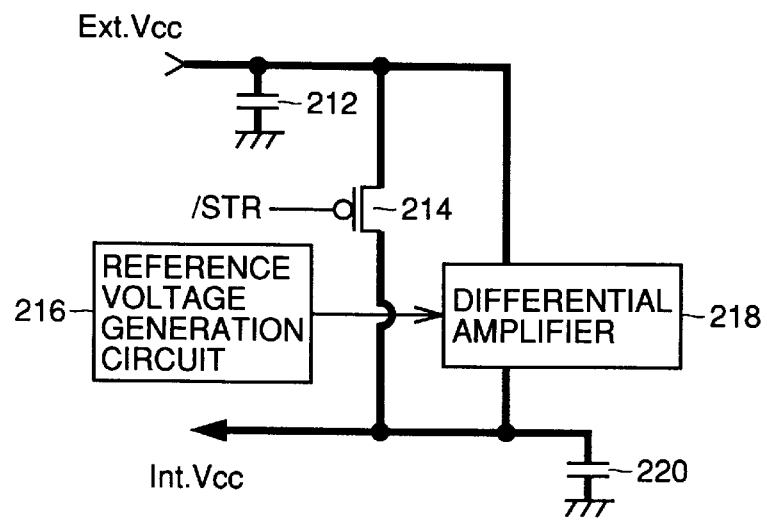
FIG. 15 is a schematic block diagram showing a configuration of a voltage down converter of a first example used in a conventional semiconductor device.
Figure 16:
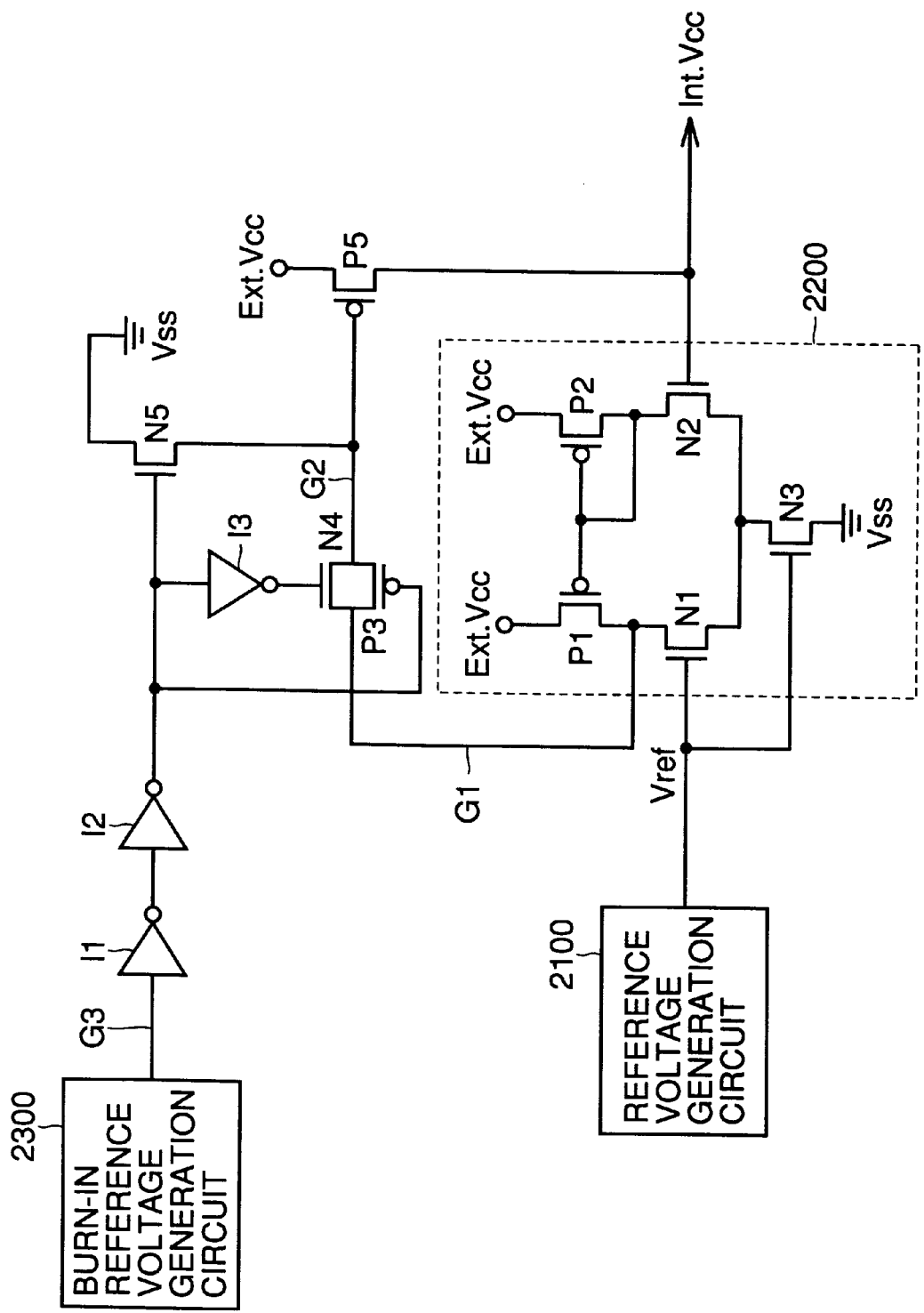
FIG. 16 is a circuit diagram showing a configuration of a voltage down converter of a second example used in a conventional semiconductor device.
Figure 17:
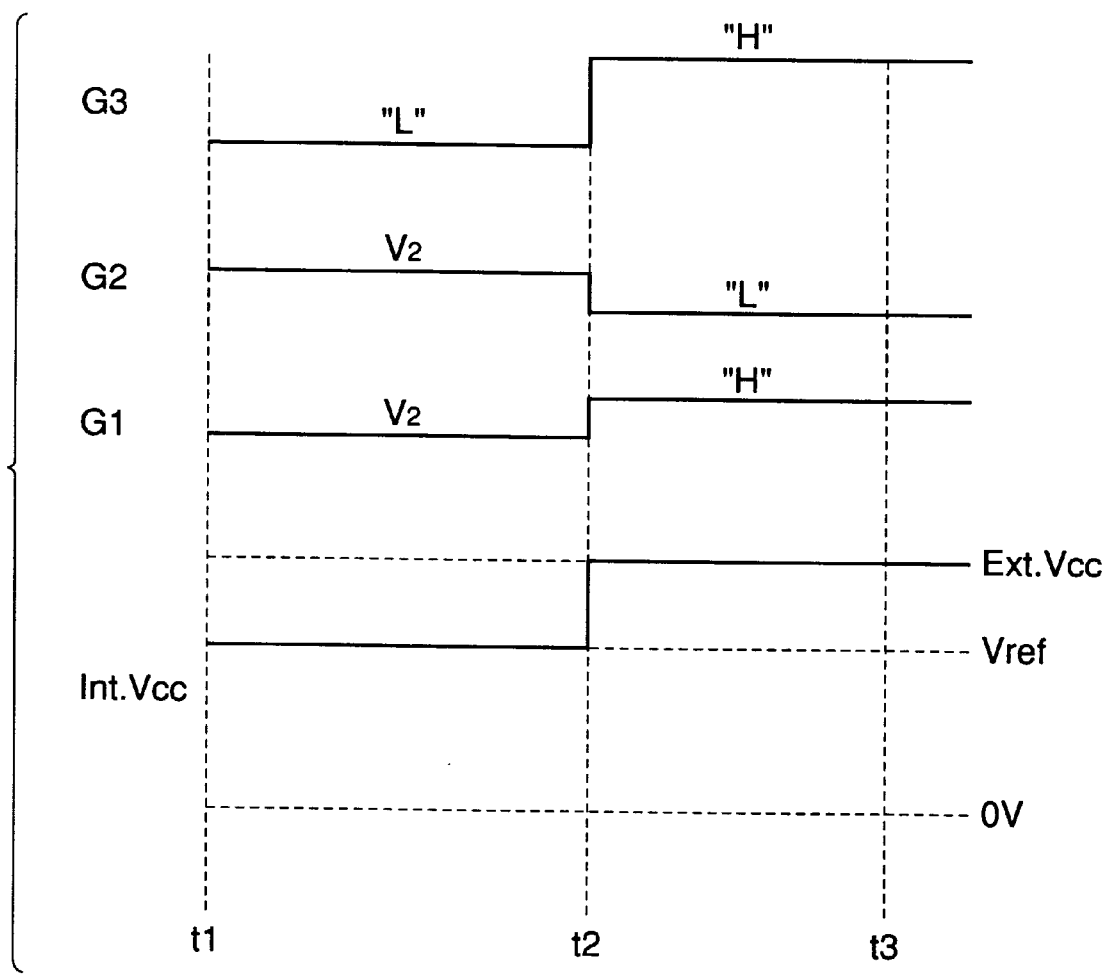
FIG. 17 is a waveform diagram illustrating an operation of the voltage down converter of FIG. 16.

With reference to FIGS. 12, 13 and 14, at the time of the normal operation, that is, when burn-in mode detection signal STR attains an L level, differential amplifier 42 generates internal power supply potential Int.VccP supplied to the peripheral circuitry and differential amplifier 1400 generates internal power supply potential Int.VccS supplied to the memory cell array.

At the time of burn-in mode, that is, when burn-in mode detection signal STR attains an H level, in differential amplifier 42, internal power supply potential Int.VccP becomes equal to external power supply potential Ext.VccP because a P channel transistor which drives internal power supply potential Int.VccP is rendered conductive.

At this time a gate potential of driving P channel transistor 110 in differential amplifier 1400 is at the level of internal power supply potential Int.Vcc because of the conductive state of N channel transistor 108. Therefore the potential of a drain of P channel transistor 110 falls by a threshold value of P channel transistor 110 compared with the potential of a source. That is, the level of internal power supply potential Int.Vcc falls down by the threshold value of P channel transistor 110 compared with external power supply potential Ext.VccP. The adjustment of the voltage drop is possible by providing a plurality of transistors, which are diode connected at the time of burn-in mode and are turned to the conductive state at the normal operation, at an output of active amplifier 94.

As described above, in the burn-in mode, the potential difference is generated between internal power supply potential Int.VccS and internal power supply potential Int.VccP corresponding to the threshold value of P channel transistor 110. Thus even at the burn-in mode, the same potential difference as at the normal operation is ensured between internal power supply potential Int.VccS and internal power supply potential Int.VccP.

Thus without externally providing two different external power supply voltages, the same potential difference as at the normal operation can be provided for the internal power supply potentials even at the burn-in mode. In this manner, stress conditions applied to the memory cell array and to the peripheral circuitry are made approximately equal, thus reliability test in conformity with the actual operation is allowed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   (a) a first power supply terminal receiving a first power supply potential;
   (b) a second power supply terminal receiving a second power supply potential higher than said first power supply potential;
   (c) controlling means for generating a test mode signal in response to an external designation; and
   (d) first voltage down converting means for receiving said first and said second power supply potential and generating a first intermediate potential by lowering said second power supply potential;
   said first voltage down converting means including
      (d-1) a first output node, outputting said first intermediate potential,
      (d-2) first reference potential generating means for generating a first reference potential as a reference for said first intermediate potential,
      (d-3) a first internal node receiving said second power supply potential,
      (d-4) first comparing means for comparing said first reference potential with a potential of said first output node, said first comparing means having first inactivating means for inactivating a comparison operation in response to said test mode signal, and
      (d-5) first driving means for supplying a current from said first internal node to said first output node according to an output of said first comparing means when said test mode signal is inactivated and connecting said first output node and said first internal node when said test mode signal is activated.

2. The semiconductor device according to claim 1, wherein said first driving means includes,
   a P channel MOS transistor having a source receiving a potential of said first internal node and a drain coupled with said first output node, and
   switching means for coupling a gate of said P channel MOS transistor with said first power supply potential in response to the activation of said test mode signal, and
   the gate of said P channel MOS transistor being further coupled with the output of said first comparing means.

3. The semiconductor device according to claim 1, wherein said first inactivating means includes an MOS transistor for cutting an operating current of said first comparing means in response to the activation of said test mode signal.

4. The semiconductor device according to claim 1, wherein said first reference potential generating means includes,
   voltage generating means for generating a standard potential,
   current controlling means for controlling a value of current flowing from said first internal node in accordance with said standard potential, and
   converting means for converting said value of current flowing via said current controlling means to said first reference potential.

5. The semiconductor device according to claim 1, further comprising an input terminal receiving an externally applied input signal,
   wherein said controlling means includes
      rectifying means for receiving said input signal,
      a P channel transistor having a gate receiving said second power supply potential and a source receiving an output of said rectifying means,
      resistance means for coupling a drain of said P channel transistor with said first power supply potential, and
      coupling means for coupling the drain of said P channel transistor with said first power supply potential in response to the externally applied designation, and
      the drain of said P channel transistor outputs a trigger signal to activate said test mode signal.

6. The semiconductor device according to claim 1, further comprising:
   (a) a first internal circuit receiving said first intermediate potential;
   (b) a second internal circuit receiving a second intermediate potential;
   (c) a third power supply terminal for receiving a third power supply potential higher than said first power supply potential; and (d) second voltage down converting means for receiving said first power supply potential and said third power supply potential and generating said second intermediate potential by lowering said third power supply potential, and said second voltage down converting means including
  (d-1) a second output node outputting said second intermediate potential,
  (d-2) second reference potential generating means for generating a second reference potential as a reference for said second intermediate voltage,
  (d-3) a second internal node receiving said third power supply potential,
  (d-4) second comparing means for receiving and comparing said second reference potential and a potential at said second output node, said second comparing means having second inactivating means for inactivating a comparison operation in response to said test mode signal; and
  (d-5) second driving means for supplying a current from said second internal node to said second output node according to an output of said second comparing means when said test mode signal is inactivated and for connecting said second output node and said second internal node when said test mode signal is activated.

7. The semiconductor device according to claim 6, further comprising connecting means for connecting said first internal node and said second internal node in response to the inactivation of said test mode signal.

8. The semiconductor device according to claim 7, wherein
  said connecting means includes a P channel transistor having a gate receiving said test mode signal and connecting said first internal node and said second internal node.

9. The semiconductor device according to claim 1, further comprising:
  a first internal circuit receiving said first intermediate potential,
  a second internal circuit receiving a second intermediate potential; and
  second voltage down converting means for receiving said first and second power supply potential and generating said second intermediate potential by lowering said second power supply potential, wherein said second voltage down converting means includes,
    a second output node outputting said second intermediate potential,
    second reference potential generating means for generating a second reference potential as a reference for said second intermediate potential,
    second comparing means for receiving and comparing said second reference potential and a potential at said second output node, said second comparing means having second inactivating means for inactivating a comparison operation in response to said test mode signal, and
    second driving means for supplying a current from said first internal node to said second output node according to an output of said second comparing means when said test mode signal is inactivated and for setting a potential of said second output node lower than the potential of said first internal node by a prescribed potential difference when said test mode signal is activated.

10. The semiconductor device according to claim 9, wherein said second driving means includes,
  a P channel MOS transistor having a source receiving the potential of said first internal node, a drain coupled with said second output node and a gate coupled with the output of said second comparing means, and
  switching means for connecting the gate and the drain of said P channel MOS transistor in response to an activation of said test mode signal.

* * * * *

UNITED STATES PATENT AND TRADEMARK OFFICE
CERTIFICATE OF CORRECTION

PATENT NO. : 6,038,189
DATED : March 14, 2000
INVENTOR(S) : Fukashi MORISHITA

It is certified that error appears in the above-identified patent and that said Letters Patent is hereby corrected as shown below:

On the Title page:

After "Section [58]", insert --Section [56], References Cited, U.S. Patent Documents, list the following documents:

| | | | |
|---|---|---|---|
| 5,321,653 | 6/1994 | Suh, et al. | ...............365/189.09 |
| 5,694,364 | 12/1997 | Morishita, et al. | .........365/201--. |

After "U.S. Patent Documents", insert --Foreign Patent Documents, list the following documents:

| | | |
|---|---|---|
| 6-103793 | 4/1994 | Japanese |
| 8-138382 | 5/1996 | Japanese |
| 9-7370 | 1/1997 | Japanese--. |

After "Foreign Patent Documents", insert --Other Publications, list the following documents:

"ULSI-DRAM Technology," September 25, 1992, p. 196.
"Ultra LSI Memory," by Kiyoo ITO, November 5, 1994, pp. 299-303--.

Signed and Sealed this

Twenty-fourth Day of April, 2001

Attest:

NICHOLAS P. GODICI

Attesting Officer        Acting Director of the United States Patent and Trademark Office